United States Patent [19]

Jang et al.

[11] Patent Number: 5,741,740
[45] Date of Patent: Apr. 21, 1998

[54] SHALLOW TRENCH ISOLATION (STI) METHOD EMPLOYING GAP FILLING SILICON OXIDE DIELECTRIC LAYER

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company, Ltd., Hsin-Chu, Taiwan

[21] Appl. No.: 873,836

[22] Filed: Jun. 12, 1997

[51] Int. Cl.⁶ ............................................. H01L 21/76
[52] U.S. Cl. ..................... 438/435; 438/424; 438/437; 438/789; 148/DIG. 50
[58] Field of Search ........................... 438/424, 425, 438/427, 435, 437, 789; 148/DIG. 50

[56] References Cited

U.S. PATENT DOCUMENTS

| | | | |
|---|---|---|---|
| 4,950,624 | 8/1990 | Inuzima et al. | 438/789 |
| 5,410,176 | 4/1995 | Liou et al. | 257/50 |
| 5,518,959 | 5/1996 | Jang et al. | 437/190 |
| 5,536,681 | 7/1996 | Jang et al. | 437/195 |
| 5,665,635 | 9/1997 | Kwon et al. | 438/437 |

Primary Examiner—Trung Dang
Attorney, Agent, or Firm—George O. Saile; Stephen B. Ackerman; Alek P. Szecsy

[57] ABSTRACT

A method for filling a trench within a silicon substrate. There is first provided a silicon substrate having a trench formed therein. There is then oxidized thermally the silicon substrate to form within the trench a thermal silicon oxide trench liner layer. There is then formed upon the thermal silicon oxide trench liner layer a conformal silicon oxide intermediate layer formed through a plasma enhanced chemical vapor deposition (PECVD) method employing a silane silicon source material. Finally, there is then formed upon the conformal silicon oxide intermediate layer a gap filling silicon oxide trench fill layer through an ozone assisted sub-atmospheric pressure thermal chemical vapor deposition (SACVD) method employing an ozone oxidant and a tetra-ethyl-ortho-silicate (TEOS) silicon source material. To provide improved properties of the gap filling silicon oxide trench fill layer the thermal silicon oxide trench liner layer may be treated with a nitrogen containing plasma prior to forming the conformal silicon oxide intermediate layer thereupon.

11 Claims, 2 Drawing Sheets

SHALLOW TRENCH ISOLATION (STI) METHOD EMPLOYING GAP FILLING SILICON OXIDE DIELECTRIC LAYER

BACKGROUND OF THE INVENTION

1. Field of the Invention

The present invention relates generally to methods for forming trench fill layers within trenches within substrates employed in integrated circuit fabrication. More particularly, the present invention relates to methods for forming gap filling ozone assisted thermal chemical vapor deposited (CVD) silicon oxide trench fill layers within trenches within substrates employed in integrated circuit fabrication.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit device technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CMP) planarizing method to provide a nominally planarized surface to a trench isolation region formed from a trench fill dielectric layer formed within the trench. Trench isolation regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure tooling.

When forming within advanced integrated circuits trench isolation regions within isolation trenches, it has become common to employ as trench fill dielectric layers gap filling silicon oxide layers formed through ozone assisted sub-atmospheric pressure thermal chemical vapor deposition (SACVD) methods. Silicon oxide layers formed through such methods are desirable since such silicon oxide layers typically possess the inherently superior gap filling characteristics desirable for trenches of limited dimensions typically encountered in advanced integrated circuit fabrication.

While gap filling silicon oxide layers formed through ozone assisted sub-atmospheric pressure thermal chemical vapor deposition (SACVD) methods are thus desirable as trench fill layers within trenches within advanced integrated circuit fabrication, methods through which are formed such gap filling silicon oxide layers are not entirely without problems. Specifically, it is known in the art of integrated circuit fabrication that gap filling silicon oxide layers formed through ozone assisted sub-atmospheric pressure thermal chemical vapor deposition (SACVD) methods exhibit a surface sensitivity dependent upon the substrate layers upon which are formed those gap filling silicon oxide layers. In particular, when employing as substrate layers thermally grown silicon oxide layers which are typically employed as isolation trench liner layers within isolation trenches formed within silicon semiconductor substrates, gap filling silicon oxide layers formed through ozone assisted sub-atmospheric pressure thermal chemical vapor deposition (SACVD) methods exhibit inhibited formation rates in comparison with otherwise equivalent gap filling silicon oxide layers formed through ozone assisted sub-atmospheric pressure thermal chemical vapor deposition (SACVD) methods upon substrate layers other than thermally grown silicon oxide layers. The gap filling silicon oxide layers formed through the ozone assisted sub-atmospheric pressure thermal chemical vapor deposition (SACVD) methods upon the thermally grown silicon oxide layers also typically exhibit inferior bulk quality (as determined through wet etch rates in dilute hydrofluoric acid) and enhanced surface roughness in comparison with otherwise equivalent gap filling silicon oxide layers formed through ozone assisted sub-atmospheric pressure thermal chemical vapor deposition (SACVD) methods upon substrate layers other than thermally grown silicon oxide layers.

Inhibited formation rates within isolation trenches within semiconductor substrates of gap filling silicon oxide trench fill layers formed through ozone assisted sub-atmospheric pressure thermal chemical vapor deposition (SACVD) methods are undesirable since there is then formed within those isolation trenches gap filling silicon oxide trench fill layers which are particularly susceptible to dishing when subsequently planarized through chemical mechanical polish (CMP) planarizing methods. Similarly, inferior bulk quality of such gap filling silicon oxide trench fill layers is undesirable since inferior bulk quality of such gap filling silicon oxide trench fill layers often compromises the dielectric properties of such gap filling silicon oxide trench fill layers. Finally, enhanced surface roughness of such gap filling silicon oxide trench fill layers is undesirable since enhanced surface roughness of such gap filling silicon oxide trench fill layers often provides gap filling silicon oxide trench fill layers of enhanced porosity.

It is thus towards the goal of forming within advanced integrated circuits gap filling silicon oxide trench fill layers formed through ozone assisted sub-atmospheric pressure thermal chemical vapor deposition (SACVD) methods with enhanced bulk quality and diminished surface roughness, while avoiding a surface sensitivity when forming those gap filling silicon oxide trench fill layers, that the present invention is generally directed.

Methods and materials through which silicon oxide layers may be formed with desirable properties within integrated circuits are known in the art of integrated circuit fabrication. For example, Liou et al., in U.S. Pat. No. 5,410,176, disclose a method for forming within a shallow trench within an integrated circuit a silicon oxide shallow trench isolation region layer. The silicon oxide shallow trench isolation region layer is formed from deposited silicon oxide spacer layers at the sidewalls of the shallow trench and a thermally grown silicon oxide layer within the trench at locations other than those occupied by the deposited silicon oxide spacer layers.

In addition, Jang et al., in U.S. Pat. No. 5,518,959, disclose a method for selectively depositing within integrated circuits silicon oxide spacer layers. The method exploits an incubation time observed when forming within integrated circuits silicon oxide layers through ozone assisted thermal chemical vapor deposition (CVD) methods upon titanium nitride patterned metal layers. The incubation time is observed in comparison with silicon oxide substrate layers over which are formed those titanium nitride patterned metal layers, where the silicon oxide substrate layers are formed through plasma enhanced chemical vapor deposition (PECVD) methods.

Finally, Jang et al., in U.S. Pat. No. 5,536,681, disclose a method for improving the gap filling capabilities of silicon oxide layers formed through ozone assisted sub-atmospheric pressure thermal chemical vapor deposition (SACVD) methods. The method employs a nitrogen plasma treatment upon selected topographic portions of a silicon oxide substrate layer formed through a plasma enhanced chemical vapor deposition (PECVD) method, upon which silicon oxide substrate layer is formed a gap filling silicon oxide layer formed through an ozone assisted sub-atmospheric pressure thermal chemical vapor deposition (SACVD) method.

Desirable in the art are additional methods through which trenches within substrates employed within integrated circuit fabrication may be filled with gap filling silicon oxide trench fill layers formed through ozone assisted sub-atmospheric pressure thermal chemical vapor deposition (SACVD) methods, while: (1) avoiding a surface sensitivity when forming those gap filling silicon oxide trench fill layers; (2) providing gap filling silicon oxide trench fill layers with enhanced bulk quality (as determined through etch rates in dilute hydrofluoric acid); and (3) providing gap filling silicon oxide trench fill layers with diminished surface roughness. Particularly desirable in the art are additional methods through which isolation trenches within semiconductor substrates employed within integrated circuit fabrication may be filled with gap filling silicon oxide trench fill dielectric layers formed through ozone assisted sub-atmospheric pressure thermal chemical vapor deposition (SACVD) methods in accord with the foregoing three objects. It is towards these goals that the present invention is more specifically directed.

SUMMARY OF THE INVENTION

A first object of the present invention is to provide a method through which a trench within a substrate employed in integrated circuit fabrication may be filled with a gap filling silicon oxide trench fill layer formed through a sub-atmospheric pressure thermal chemical vapor deposition (SACVD) method.

A second object of the present invention is to provide a method in accord with the first object of the present invention, where there is avoided a surface sensitivity when forming the gap filling silicon oxide trench fill layer.

A third object of the present invention is to provide a method in accord with the first object of the present invention, where there is provided the gap filling silicon oxide trench fill layer with enhanced bulk quality (as determined by etch rate in dilute hydrofluoric acid).

A fourth object of the present invention is to provide a method in accord with the first object of the present invention, where there is provided the gap filling silicon oxide trench fill layer with diminished surface roughness.

A fifth object of the present invention is to provide a method in accord with the second object of the present invention, the third object of the present invention and/or the fourth object of the present invention, where the substrate is a semiconductor substrate and the trench is an isolation trench within the semiconductor substrate.

A sixth object of the present invention is to provide a method in accord with the first object of the present invention, the second object of the present invention, the third object of the present invention, the fourth object of the present invention and/or the fifth object of the present invention, which method is readily manufacturable.

In accord with the objects of the present invention, there is provided by the present invention a method for forming within a trench within a substrate employed in integrated circuit fabrication a gap filling silicon oxide trench fill layer. To practice the method of the present invention, there is first provided a silicon substrate having a trench formed therein. There is then thermally oxidized the silicon substrate to form within the trench a thermal silicon oxide trench liner layer. There is then formed upon the thermal silicon oxide trench liner layer a conformal silicon oxide intermediate layer formed through a plasma enhanced chemical vapor deposition (PECVD) method employing a silane silicon source material. Finally, there is formed upon the conformal silicon oxide intermediate layer a gap filling silicon oxide trench fill layer formed through an ozone assisted sub-atmospheric pressure thermal chemical vapor deposition (SACVD) method employing an ozone oxidant and a tetra-ethyl-orthosilicate (TEOS) silicon source material. To provide optimal properties of the gap filling silicon oxide trench fill layer, the thermal silicon oxide trench liner layer may be treated with a nitrogen containing plasma prior to forming the conformal silicon oxide intermediate layer thereupon.

The present invention provides a method through which there may be formed within a trench within a substrate employed in integrated circuit fabrication a gap filling silicon oxide trench fill layer formed through a sub-atmospheric pressure thermal chemical vapor deposition (SACVD) method, where there is avoided a surface sensitivity when forming the gap filling silicon oxide trench fill layer and where there is provided a gap filling silicon oxide trench fill layer with enhanced bulk quality (as determined through etch rate in dilute hydrofluoric acid) and with diminished surface roughness. The method of the present invention realizes these objects by forming through a thermal oxidation method within a trench within a silicon substrate a thermal silicon oxide trench liner layer and subsequently forming upon the thermal silicon oxide trench liner layer a conformal silicon oxide intermediate layer formed through a plasma enhanced chemical vapor deposition (PECVD) method prior to forming over thermal silicon oxide trench liner layer a gap filling silicon oxide trench fill layer through an ozone assisted sub-atmospheric pressure thermal chemical vapor deposition (SACVD) method.

The method of the present invention may be employed where the substrate is a semiconductor substrate and where the trench is an isolation trench within the semiconductor substrate. Provided that the substrate is a silicon substrate, the method of the present invention does not discriminate with respect to the nature of the trench which is formed within the substrate. Thus, the method of the present invention may be employed where the substrate is a semiconductor substrate and the trench is an isolation trench within the semiconductor substrate.

The method of the present invention is readily manufacturable. The method of the present invention provides a novel ordering of integrated circuit thermal oxidation methods, nitrogen plasma treatment methods and silicon oxide layer deposition methods which are otherwise generally known in the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
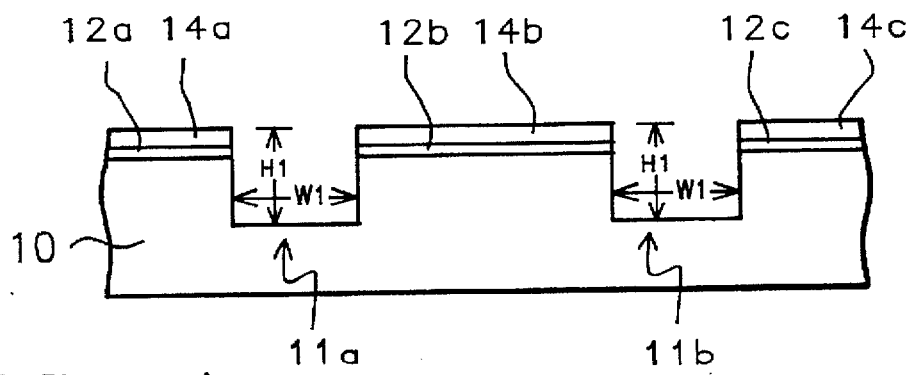
FIG. 1 to FIG. 6 show a series of schematic cross-sectional diagrams illustrating the results of progressive stages in forming within an isolation trench within a silicon semiconductor substrate employed in integrated circuit fabrication a patterned planarized gap filling silicon oxide trench fill layer formed, while avoiding a surface sensitivity and while providing enhanced bulk quality and diminished surface roughness, in accord with a preferred embodiment of the method of the present invention.

The present invention provides a method for forming, while avoiding a surface sensitivity and while providing an enhanced bulk quality and a diminished surface roughness, a gap filling silicon oxide trench fill layer formed through an ozone assisted sub-atmospheric pressure thermal chemical vapor deposition (SACVD) method within a trench within a substrate employed within integrated circuit fabrication. To achieve the foregoing objects, the method of the present invention provides that there is formed within a trench within a silicon substrate through a thermal oxidation method a thermal silicon oxide trench liner layer. There is then formed upon the thermal silicon oxide trench liner layer a conformal silicon oxide intermediate layer formed through a plasma enhanced chemical vapor deposition (PECVD) method employing a silane silicon source material. There is finally formed upon the conformal silicon oxide intermediate layer a gap filling silicon oxide trench fill layer formed through an ozone assisted sub-atmospheric pressure thermal chemical vapor deposition (SACVD) method employing an ozone oxidant and a tetra-ethyl-ortho-silicate (TEOS) silicon source material. To provide optimal properties within the gap filling silicon oxide trench fill layer, the thermal silicon oxide trench liner layer may be treated with a nitrogen containing plasma prior to forming the conformal silicon oxide intermediate layer thereupon.

Although the preferred embodiment of the method of the present invention illustrates the method of the present invention employed in forming, while avoiding a surface sensitivity and while providing an enhanced bulk quality and a diminished surface roughness, a pair of patterned planarized gap filling silicon oxide trench fill layers within a pair of isolation trenches within a silicon semiconductor substrate employed in integrated circuit fabrication, the method of the present invention may also be employed in forming, while avoiding a pattern sensitivity and while providing an enhanced bulk quality and a diminished surface roughness, the gap filling silicon oxide trench fill layer or the patterned planarized gap filling silicon oxide trench fill layers of the method of the present invention within trenches other than isolation trenches within silicon substrates other than silicon semiconductor substrates. The method of the present invention may be employed in forming, while avoiding a surface sensitivity and while providing an enhanced bulk quality and a diminished surface roughness, the gap filling silicon oxide trench fill layer or the patterned planarized gap filling silicon oxide trench fill layers of the present invention into trenches within silicon substrates including but not limited to silicon semiconductor substrates and silicon solar cell substrates. For a general embodiment of the method of the present invention, the width of the trench into which is formed the gap filling silicon oxide trench fill layer is preferably greater than about 0.3 microns and the depth of the trench is preferably from about 3000 to about 5000 angstroms.

Referring now to FIG. 1 to FIG. 6, there is shown a series of schematic cross-sectional diagrams illustrating the results of progressive stages in forming, while avoiding a surface sensitivity and while providing an enhanced bulk quality and a diminished surface roughness, a pair of patterned planarized gap filling silicon oxide trench fill layers within a pair of isolation trenches within a silicon semiconductor substrate in accord with a preferred embodiment of the method of the present invention. Shown in FIG. 1 is a schematic cross-sectional diagram of the silicon semiconductor substrate at an early stage in its fabrication.

Shown in FIG. 1 is a silicon semiconductor substrate 10 having formed therein a pair of isolation trenches 11a and 11b, where a gap filling silicon oxide trench fill dielectric layer when formed into the pair of isolation trenches 11a and 11b through a sub-atmospheric pressure thermal chemical vapor deposition (SACVD) method conventional in the art of integrated circuit fabrication is typically formed with an enhanced surface sensitivity, an inferior bulk quality and an enhanced surface roughness. Although the method of the present invention may be practiced employing silicon semiconductor substrates of either dopant polarity, any dopant concentration and various crystallographic orientations, within the preferred embodiment of the method of the present invention the silicon semiconductor substrate 10 is preferably a (100) silicon semiconductor substrate having an N- or P- doping.

As is illustrated in FIG. 1, each of the isolation trenches 11a and 11b within the silicon semiconductor substrate 10 has a width W1 and a height H1, where the width W1 is preferably greater than about 0.3 microns while the height H1 is preferably from about 3000 to about 5000 angstroms.

Formed upon the silicon semiconductor substrate 10 and defining the widths W1 of the isolation trenches 11a and 11b is a series of patterned silicon oxide pad oxide layers 12a, 12b and 12c having formed and aligned thereupon a series of patterned silicon nitride layers 14a, 14b and 14c. Within the preferred embodiment of the method of the present invention, the series of patterned silicon nitride layers 14a, 14b and 14c serves as a series of patterned chemical mechanical polish (CMP) polish stop layers, while the series of patterned silicon oxide pad oxide layers 12a, 12b and 12c serves as a series of adhesive forming and stress reducing layers between the silicon semiconductor substrate 10 and the series of patterned silicon nitride layers 14a, 14b and 14c. While the series of patterned silicon oxide pad oxide layers 12a, 12b and 12c, and the series of patterned silicon nitride layers 14a, 14b and 14c are preferably employed within the preferred embodiment of the method of the present invention, they are not required within the method of the present invention. However, their presence provides a means for most uniformly forming within the isolation trenches 11a and 11b patterned planarized gap filling silicon oxide trench fill layers through the preferred embodiment of the method of the present invention.

The patterned silicon oxide pad oxide layers 12a, 12b and 12c, and the patterned silicon nitride layers 14a, 14b and 14c may be formed through methods as are conventional in the art of integrated circuit fabrication, which methods will typically, although not exclusively, employ photolithographic patterning of a blanket silicon oxide pad oxide layer which is formed beneath a corresponding blanket silicon nitride layer. The blanket silicon nitride layer and the blanket silicon oxide pad oxide layer may similarly be formed through methods as are conventional in the art of integrated circuit fabrication, including but not limited to thermal oxidation methods, chemical vapor deposition (CVD) methods and physical vapor deposition (PVD) sputtering methods, as are appropriate. Preferably, the patterned silicon oxide pad oxide layers 12a, 12b and 12c, and the corresponding blanket silicon oxide pad oxide layer, are formed to a thickness of from about 90 to about 130 angstroms each, where the blanket silicon oxide pad oxide layer is preferably formed through a thermal oxidation method at a temperature of from about 850 to about 950 degrees centigrade. Preferably, the patterned silicon nitride layers 14a, 14b and 14c, and the corresponding blanket silicon nitride layer, are formed to a thickness of from about 1500 to about 2000 angstroms each.

Figure 2:
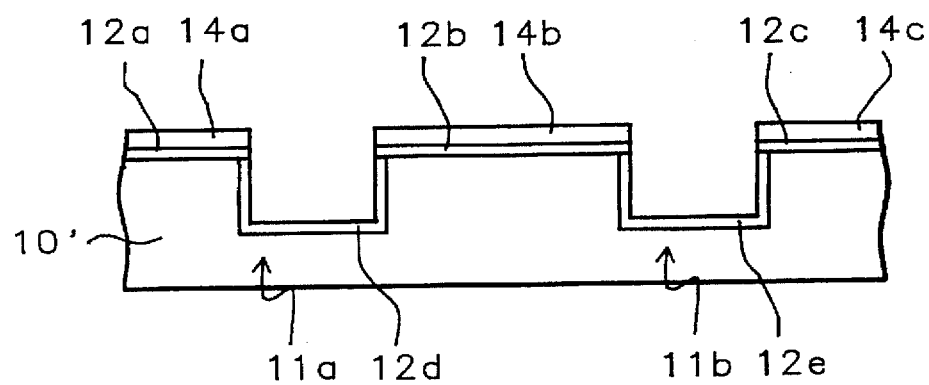

Referring now to FIG. 2, there is shown a schematic cross-sectional diagram illustrating the results of further processing of the silicon semiconductor substrate 10 whose schematic cross-sectional diagram is illustrated in FIG. 1. Shown in FIG. 2 is the presence of a pair of patterned silicon oxide trench liner layers 12d and 12e formed into the corresponding isolation trenches 11a and 11b. Within the preferred embodiment of the method of the present invention, the patterned silicon oxide trench liner layers 12d and 12e are formed in a self aligned fashion within each isolation trench 11a or 11b through a thermal oxidation method analogous or equivalent to the thermal oxidation method preferably employed in forming the blanket silicon oxide pad oxide layer from which is formed the patterned silicon oxide pad oxide layers 12a, 12b and 12c. Under such circumstances, there is simultaneously also formed from the silicon semiconductor substrate 10 a partially consumed silicon semiconductor substrate 10' when the patterned silicon oxide trench liner layers 12d and 12e are formed within the isolation trenches 11a and 11b. Preferably, the patterned silicon oxide trench liner layers 12d and 12e so formed have a thickness of from about 200 to about 400 angstroms each. The patterned silicon oxide trench liner layers 12d and 12e are particularly desirable within advanced integrated circuit fabrication since, when formed through a thermal oxidation method, they provide a superior leakage barrier between the partially consumed silicon semiconductor substrate 10' and trench fill dielectric layers subsequently formed within the isolation trenches 11a and 11b. Unfortunately, when formed through the thermal oxidation method, the patterned silicon oxide trench liner layers 12d and 12e provide substrate layers upon which there is exhibited a surface sensitivity manifested as an inhibited formation rate of gap filling silicon oxide trench fill layers formed through conventional ozone assisted sub-atmospheric pressure thermal chemical vapor deposition (SACVD) methods upon the patterned silicon oxide trench liner layers 12d and 12e. Such gap filling silicon oxide trench fill layers so formed typically also exhibit inferior bulk quality (as determined through etch rates in dilute hydrofluoric acid) and enhanced surface roughness.

Figure 3:
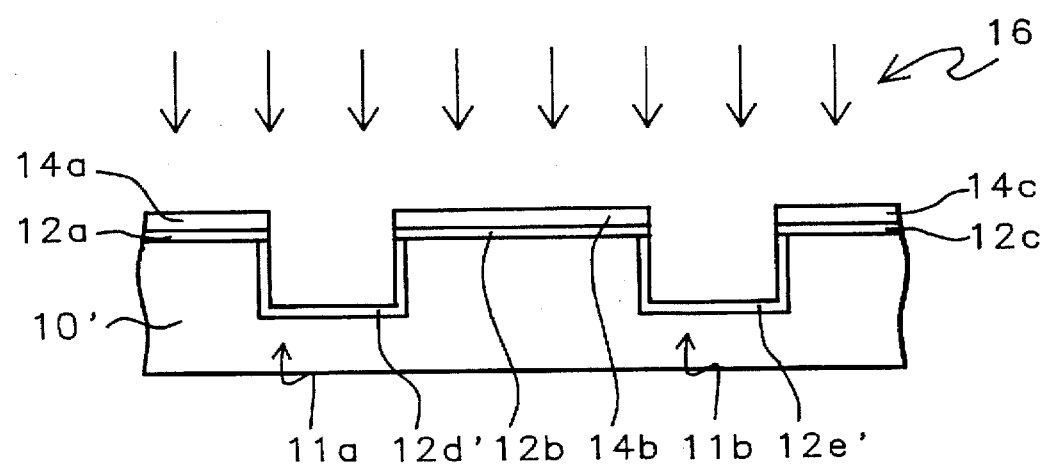

Referring now to FIG. 3, there is shown a schematic cross-sectional diagram illustrating the results of further processing of the partially consumed silicon semiconductor substrate 10' whose schematic cross-sectional diagram is illustrated in FIG. 2. Shown in FIG. 2 is a schematic cross-sectional diagram of a partially consumed silicon semiconductor substrate 10' otherwise equivalent to the partially consumed silicon semiconductor substrate 10' whose schematic cross-sectional diagram is illustrated in FIG. 2, but wherein there is treated the patterned silicon oxide trench liner layers 12d and 12e with a nitrogen containing plasma 16 to form a pair of nitrogen plasma treated patterned silicon oxide trench liner layers 12d' and 12e'. Preferably, the nitrogen plasma treated patterned silicon oxide trench liner layers 12d' and 12e' are formed employing the nitrogen containing plasma 16 which comprises at least about 20 percent nitrogen by volume. The nitrogen containing plasma 16 treatment also preferably employs: (1) a reactor chamber pressure of from about 1 to about 2 torr; (2) a first radio frequency power of from about 50 to about 150 watts at a first radio frequency of 13.56 MHZ and a simultaneous second radio frequency power of from about 400 to about 500 watts at a simultaneous second radio frequency of 550 kHz; (3) a partially consumed silicon semiconductor substrate 10' temperature of from about 360 to about 440 degrees centigrade; (4) a nitrogen flow rate of from about 400 to about 600 standard cubic centimeters per minute (sccm); and (5) a background helium flow rate of from about 1500 to about 2500 standard cubic centimeters per minute (sccm). Preferably, the nitrogen plasma treated patterned silicon oxide trench liner layers 12d' and 12e' are formed from the patterned silicon oxide trench liner layers 12d and 12e by exposure of the patterned silicon oxide trench liner layers 12d and 12e to the nitrogen containing plasma 16 for a time period of from about 50 to about 70 seconds.

Figure 4:
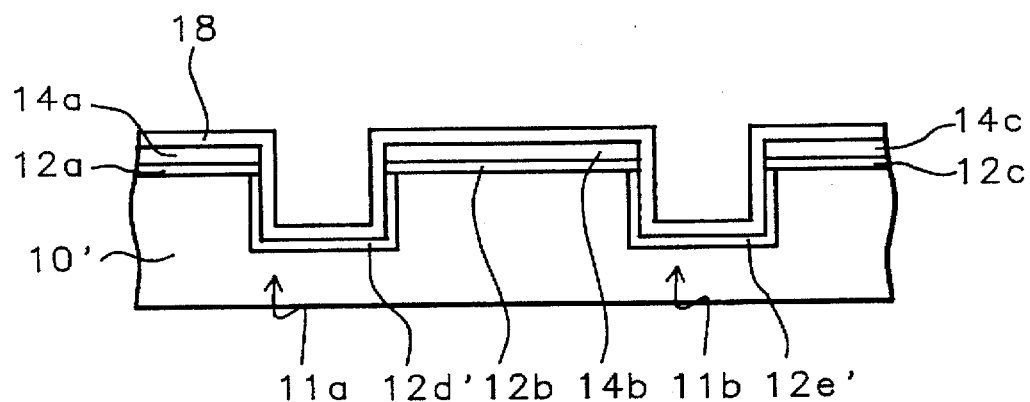

Referring now to FIG. 4, there is shown a schematic cross-sectional diagram illustrating the results of further processing of the partially consumed silicon semiconductor substrate 10' whose schematic cross-sectional diagram is illustrated in FIG. 3. Shown in FIG. 4 is a schematic cross-sectional diagram of a partially consumed silicon semiconductor substrate 10' otherwise equivalent to the partially consumed silicon semiconductor substrate 10' whose schematic cross-sectional diagram is illustrated in FIG. 3, but wherein there is formed over the partially consumed silicon semiconductor substrate 10' and upon the nitrogen plasma treated patterned silicon oxide trench liner layers 12d' and 12e' a conformal silicon oxide intermediate layer 18. For the method of the present invention, the conformal silicon oxide intermediate layer 18 is formed through a plasma enhanced chemical vapor deposition (PECVD) method employing a silane silicon source material. Preferably, plasma enhanced chemical vapor deposition (PECVD) method through which is formed the conformal silicon oxide intermediate layer 18 also employs: (1) a reactor chamber pressure of from about 2.5 to about 3.5 torr; (2) a radio frequency power of from about 150 to about 250 watts at a radio frequency of 13.56 MHZ; (3) a partially consumed silicon semiconductor substrate 10' temperature of from about 360 to about 440 degrees centigrade; (4) a silane flow rate of from about 60 to about 100 standard cubic centimeters per minute (sccm); and (5) a nitrous oxide (N2O) oxidant flow rate of from about 1500 to about 2000 standard cubic centimeters per minute (sccm). Preferably, the conformal silicon oxide intermediate layer 18 is formed to a thickness of from about 300 to about 500 angstroms over the partially consumed silicon semiconductor substrate 10' and upon the nitrogen plasma treated patterned silicon oxide trench liner layers 12d' and 12e'.

Figure 5:
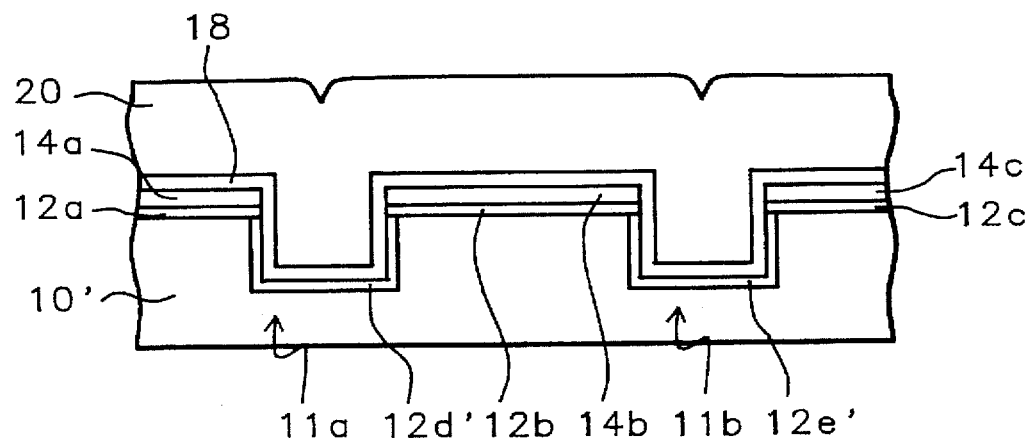

Referring now to FIG. 5, there is shown a schematic cross-sectional diagram illustrating the results of further processing of the partially consumed silicon semiconductor substrate 10' whose schematic cross-sectional diagram is illustrated in FIG. 4. Shown in FIG. 5 is a schematic cross-sectional diagram of a partially consumed silicon semiconductor substrate 10' otherwise equivalent to the partially consumed silicon semiconductor substrate 10' whose schematic cross-sectional diagram is illustrated in FIG. 4, but wherein there is formed upon the conformal silicon oxide intermediate layer 18 a gap filling silicon oxide trench fill layer 20. Within the method of the present invention, the gap filling silicon oxide trench fill layer 20 is formed through an ozone assisted sub-atmospheric pressure thermal chemical vapor deposition (SACVD) method. Due to the elevated pressures at which ozone assisted sub-atmospheric pressure thermal chemical vapor deposition (SACVD) methods are employed, these methods preclude plasma activation, but nonetheless provide superior gap filling and planarizing properties to gap filling silicon oxide trench fill layers formed through these methods. Preferably, the ozone assisted sub-atmospheric pressure thermal chemical vapor deposition (SACVD) method employed in forming the gap filling silicon oxide trench fill layer 20 employs an ozone oxidant and a tetra-ethyl-ortho-silicate (TEOS) silicon source material at an ozone:TEOS volume ratio of from about 10:1 to about 15:1.

Other parameters employed in forming the gap filling silicon oxide trench fill layer 20 through the sub-atmospheric pressure thermal chemical vapor deposition (CVD) method include: (1) a reactor chamber pressure of from about 400 to about 600 torr; (2) a partially consumed silicon semiconductor substrate 10' temperature of from about 360 to about 440 degrees centigrade; (3) an ozone concentration of about 12 weight percent in an oxygen carrier gas; (4) a tetra-ethyl-ortho-silicate (TEOS) flow rate of from about 27 to about 42 standard cubic centimeters per minute (sccm); (5) an oxygen (ozone carrier gas) flow rate of from about 4000 to about 6000 standard cubic centimeters per minute (sccm); and (6) a helium (tetra-ethyl-ortho-silicate (TEOS) carrier gas) flow rate of from about 1850 to about 2750 standard cubic centimeters per minute (sccm). Preferably, the gap filling silicon oxide trench fill layer 20 is formed to a thickness of from about 6000 to about 8000 angstroms over the partially consumed silicon semiconductor substrate 10' and upon the conformal silicon oxide intermediate layer 18.

As is illustrated in FIG. 5, the gap filling silicon oxide trench fill layer 20 is formed while avoiding a surface sensitivity over the isolation trenches 11a and 11b since within the preferred embodiment of the method of the present invention the gap filling silicon oxide trench fill layer 20 is formed upon the conformal silicon oxide intermediate layer 18 which in turn is formed upon the pair of nitrogen plasma treated patterned silicon oxide trench liner layers 12d' and 12e' rather than upon the pair of patterned silicon oxide trench liner layers 12d and 12e. While within the method of the present invention a conformal silicon oxide intermediate layer, such as the conformal silicon oxide intermediate layer 18, may by itself provide an intermediate layer upon which may be formed a gap filling silicon oxide trench fill layer, such as the gap filling silicon oxide trench fill layer 20, while avoiding a surface sensitivity over a pair of patterned silicon oxide trench liner layers, such as the pair of patterned silicon oxide trench liner layers 12d and 12e, without treating the patterned silicon oxide trench liner layers with a nitrogen containing plasma, within the preferred embodiment of the method of the present invention the conformal silicon oxide intermediate layer 18 is typically too thin to totally attenuate the surface sensitivity of the gap filling silicon oxide trench fill layer 20 with respect to the patterned silicon oxide trench liner layers 12d and 12e while still optimizing the gap filling characteristics of the gap filling silicon oxide trench fill layer 20.

Thus, within the preferred embodiment of the method of the present invention, although not necessarily within an embodiment of the method of the present invention employing a thicker conformal silicon oxide intermediate layer, the surface sensitivity of the gap filling silicon oxide trench fill layer 20 with respect to the patterned silicon oxide trench liner layers 12d and 12e is avoided through treating the patterned silicon oxide trench liner layers 12d and 12e with the nitrogen containing plasma 16 to form the nitrogen plasma treated patterned silicon oxide trench liner layers 12d' and 12e'. Within the method of the present invention, it is estimated that a conformal silicon oxide intermediate layer of thickness preferably greater than about 1200 angstroms, more preferably of thickness from about 1200 to about 1500 angstroms, is of sufficient thickness when formed upon a thermal silicon oxide trench liner layer within a trench within a silicon semiconductor substrate (where sidewall and bottom coverage of the conformal silicon oxide intermediate layer may be reduced to about 350 angstroms) such that a pattern sensitivity is avoided for a gap filling silicon oxide trench fill layer formed through an ozone assisted sub-atmospheric pressure thermal chemical vapor deposition (SACVD) method with respect to the thermal silicon oxide trench liner layer, without plasma treatment of the thermal silicon oxide trench liner layer.

With respect to either the method of the present invention or the preferred embodiment of the method of the present invention, a conformal silicon oxide intermediate layer, such as the conformal silicon oxide intermediate layer 18, nonetheless provides a layer upon which is formed a gap filling silicon oxide trench fill layer through an ozone assisted sub-atmospheric pressure thermal chemical vapor deposition (SACVD) method with diminished surface roughness.

Figure 6:
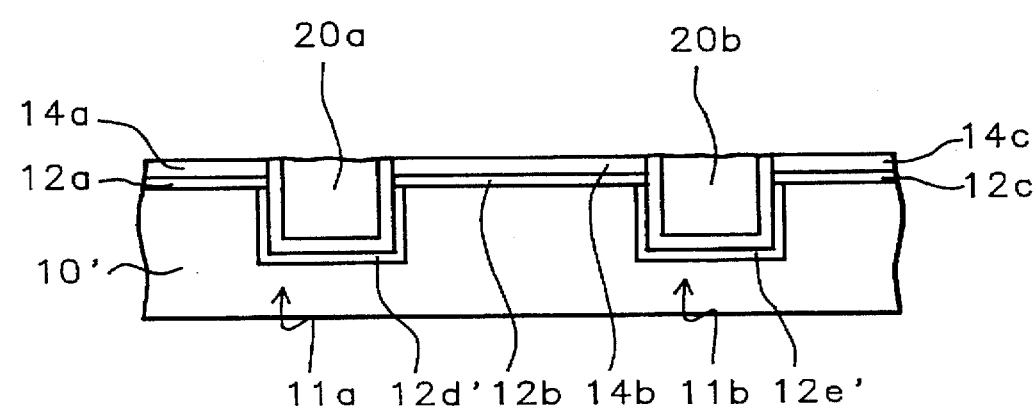

Referring now to FIG. 6, there is shown a schematic cross-sectional diagram illustrating the results of further processing to the partially consumed silicon semiconductor substrate 10' whose schematic cross-sectional diagram is illustrated in FIG. 5. Shown in FIG. 6 is the results of planarizing through a chemical mechanical polish (CMP) planarizing method the gap filling silicon oxide trench fill layer 20 and the conformal silicon oxide intermediate layer 18 as illustrated in FIG. 5 to form the patterned planarized conformal silicon oxide intermediate layers 18a and 18b having formed thereupon the patterned planarized gap filling silicon oxide trench fill layers 20a and 20b.

While any of several parameters may be employed within the chemical mechanical polish (CMP) planarizing method for forming from the gap filling silicon oxide trench fill layer 20 and the conformal silicon oxide intermediate layer 18 the patterned planarized conformal silicon oxide intermediate layers 18a and 18b and the patterned planarized gap filling silicon oxide trench fill layers 20a and 20b, the chemical mechanical polish (CMP) planarizing method employed within the preferred embodiment of the method of the present invention preferably employs: (1) a platen pressure of from about 5 to about 10 pounds per square inch (psi); (2) a platen rotation speed of from about 30 to about 60 revolutions per minute (rpm); (3) a holder counter-rotation speed of from about 30 to about 60 revolutions per minute (rpm); and (4) an aqueous silica slurry comprising about 10 to about 20 weight percent silica at a flow rate of from about 100 to about 250 cubic centimeters per minute.

EXAMPLES 1–7

Upon each silicon semiconductor substrate within a series of six silicon semiconductor substrates there was formed a thermal silicon oxide layer through thermal oxidation of the silicon semiconductor substrate at a temperature of about 900 degrees centigrade. Each of the thermal silicon oxide layers so formed was formed to a thickness of about 350 angstroms.

Upon the thermal silicon oxide layer upon a first of the six silicon semiconductor substrates was formed a second silicon oxide layer through a plasma enhanced chemical vapor deposition (PECVD) method employing tetra-ethyl-ortho-silicate (TEOS) as a silicon source material. The plasma enhanced chemical vapor deposition (PECVD) method employed: (1) a reactor chamber pressure of about 8 torr; (2) a radio frequency power of about 675 watts at a radio frequency of 13.56 MHZ; (3) a silicon semiconductor substrate temperature of about 400 degrees centigrade; (4) a tetra-ethyl-ortho-silicate (TEOS) flow rate of about 150 standard cubic centimeters per minute (sccm) in a helium carrier gas flow rate of about 800 standard cubic centimeters per minute (sccm); and (5) an oxygen oxidant at a flow rate of about 600 standard cubic centimeters per minute. The second silicon oxide layer so formed upon the first silicon semiconductor substrate was formed to a thickness of about 500 angstroms.

Upon the thermal silicon oxide layer formed upon a second of the six silicon semiconductor substrates was formed a second silicon oxide layer in accord with the second silicon oxide layer formed upon the first of the six silicon semiconductor substrates, but where the second silicon oxide layer was additionally treated with a nitrogen containing plasma. The nitrogen containing plasma employed: (1) a reactor chamber pressure of about 1.5 torr; (2) a first radio frequency power of about 100 watts at a first radio frequency of 13.56 MHZ and a simultaneous second radio frequency power of about 450 watts at a simultaneous second radio frequency of 350 kHz; (3) a silicon semiconductor substrate temperature of about 400 degrees centigrade; (4) a nitrogen flow rate of about 500 standard cubic centimeters per minute (sccm); and (5) a background helium flow rate of about 2000 standard cubic centimeters per minute (sccm). The second silicon oxide layer formed upon the second silicon semiconductor substrate was treated with the nitrogen containing plasma for a time period of about 60 seconds.

Upon the thermal silicon oxide layer upon a third of the six silicon semiconductor substrates was formed a second silicon oxide layer through a plasma enhanced chemical vapor deposition (PECVD) method employing silane as a silicon source material. The method employed: (1) a reactor chamber pressure of about 2.8 torr; (2) a radio frequency power of about 200 watts at a radio frequency of 13.56 MHZ; (3) a silicon semiconductor substrate temperature of about 400 degrees centigrade; (4) a silane flow rate of about 80 standard cubic centimeters per minute (sccm); and (5) a nitrous oxide oxidant at a flow rate of about 1800 standard cubic centimeters per minute. The second silicon oxide layer so formed upon the third silicon semiconductor substrate was formed to a thickness of about 500 angstroms.

Upon the thermal silicon oxide layer formed upon a fourth of the six silicon semiconductor substrates was formed a second silicon oxide layer in accord with the second silicon oxide layer formed upon the third of the six semiconductor substrates, but where the second silicon oxide layer was additionally treated with a nitrogen containing plasma. The nitrogen containing plasma employed: (1) a reactor chamber pressure of about 1.5 torr; (2) a first radio frequency power of about 100 watts at a first radio frequency of 13.56 MHZ and a simultaneous second radio frequency power of about 450 watts at a simultaneous second radio frequency of 350 kHz; (3) a silicon semiconductor substrate temperature of about 400 degrees centigrade; (4) a nitrogen flow rate of about 500 standard cubic centimeters per minute (sccm); and (5) a background helium flow rate of about 2000 standard cubic centimeters per minute (sccm). The second silicon oxide layer formed upon the fourth silicon semiconductor substrate was treated with the nitrogen containing plasma for a time period of about 60 seconds.

Upon the thermal silicon oxide layer formed upon a fifth of the six silicon semiconductor substrates there was formed a second silicon oxide layer in accord with the second silicon oxide layer formed upon the third of the six semiconductor substrates, but where the thermal silicon oxide layer, rather than the silicon oxide layer formed through the plasma enhanced chemical vapor deposition (PECVD) method employing silane as the silicon source material, was treated with a nitrogen containing plasma. Methods and materials employed in providing the nitrogen containing plasma were equivalent to those employed in providing the nitrogen containing plasma employed in treating the second silicon oxide layer formed upon the fourth of the six silicon semiconductor substrates.

The sixth of the six silicon semiconductor substrates had formed thereupon no second silicon oxide layer, nor did the sixth of the six silicon semiconductor substrates receive any nitrogen containing plasma treatment. There was then added to the group of six silicon semiconductor substrates a seventh silicon semiconductor substrate having formed thereupon only a native silicon oxide and neither a thermal silicon oxide layer nor a second silicon oxide layer.

Upon each of the seven silicon semiconductor substrates was then formed a gap filling silicon oxide layer formed through an ozone assisted sub-atmospheric pressure thermal chemical vapor deposition (SACVD) method employing an ozone oxidant and a tetra-methyl-ortho-silicate (TEOS) silicon source material. The ozone assisted sub-atmospheric pressure thermal chemical vapor deposition (SACVD) method also employed: (1) a reactor chamber pressure of about 450 torr; (2) a silicon semiconductor substrate temperature of about 400 degrees centigrade; (3) an ozone-:TEOS volume of about 12:1; (4) an ozone concentration in oxygen (ozone carrier gas) of about 12.5 weight percent; (5) a tetra-ethyl-ortho-silicate (TEOS) flow rate of about 35 standard cubic centimeters per minute (sccm); (6) an oxygen flow rate of about 5000 standard cubic centimeters per minute (sccm); and (7) a helium (tetra-ethyl-ortho-silicate (TEOS) carrier gas) flow rate of about 2000 standard cubic centimeters per minute (sccm).

There was determined through ellipsometric measurements the deposition rates for the seven gap filling silicon oxide layers upon the seven silicon semiconductor substrates. In addition, there was also determined the etch rate of each of the seven gap filling silicon oxide layers in 50:1 dilute hydrofluoric acid solution. The etch rates so determined were then normalized to the etch rate of a thermal silicon oxide layer within the same 50:1 dilute hydrofluoric acid solution. Finally, there was also determined for each of the seven gap filling silicon oxide layers a surface roughness through a scanning electron microscopy inspection. The values of the deposition rates, the normalized 50:1 dilute hydrofluoric acid etch rates and the surface roughnesses for the seven gap filling silicon oxide layers formed upon the seven silicon semiconductor substrates are reported in Table 1.

TABLE 1

| Example | Substrate Layer | Deposition Rate (angstroms/min) | Wet Etch Rate (normalized) | Roughness (SEM) |
|---|---|---|---|---|
| 1 | bare silicon | 1700 | 6 | smooth |
| 2 | thermal oxide | 120 | >30 | rough |
| 3 | th ox/PE-TEOS | 1350 | 15 | rough |
| 4 | th ox/PE-TEOS/N2 | 1600 | 6.5 | rough |
| 5 | th ox/PE-silane | 1700 | 6 | smooth |
| 6 | th ox/PE-silane/N2 | 1550 | 6.5 | slightly rough |
| 7 | th ox/N2/PE-silane | 1700 | 6 | smooth |

As is seen from review of the data within Table I, a silicon oxide layer formed through a thermal oxidation method, and having a second silicon oxide layer formed thereupon through a plasma enhanced chemical vapor deposition (PECVD) method employing a silane silicon source material, provides a substrate layer upon which there is formed a gap filling silicon oxide layer through an ozone assisted sub-atmospheric pressure thermal chemical vapor deposition (SACVD) method while avoiding a surface sensitivity when forming the gap filling silicon oxide layer and while providing a gap filling silicon oxide layer with enhanced bulk quality and with diminished surface roughness.

As is understood by a person skilled in the art, the preferred embodiment and examples of the present invention are illustrative of the present invention rather than limiting of the present invention. Revisions and modifications may be made to materials, structures and dimensions through which is provided the preferred embodiment and examples of the present invention while still providing embodiments and examples which are within the spirit and scope of the present invention, as defined by the appended claims.

What is claimed is:

1. A method for filling a trench within a silicon substrate comprising:

providing a silicon substrate, the silicon substrate having a trench formed therein;

oxidizing thermally the silicon substrate to form within the trench a thermal silicon oxide trench liner layer;

forming upon the thermal silicon oxide trench liner layer a conformal silicon oxide intermediate layer formed through a plasma enhanced chemical vapor deposition (PECVD) method employing a silane silicon source material; and forming upon the conformal silicon oxide intermediate layer a gap filling silicon oxide trench fill layer formed through an ozone assisted sub-atmospheric pressure thermal chemical vapor deposition (SACVD) method employing an ozone oxidant and a tetra-ethyl-ortho-silicate (TEOS) silicon source material.

2. The method of claim 1 wherein the gap filling silicon oxide trench fill layer is formed with an attenuated surface sensitivity, an enhanced bulk quality and a diminished surface roughness in comparison with an otherwise equivalent gap filling silicon oxide trench fill layer formed upon an otherwise equivalent thermal silicon oxide trench liner layer absent an otherwise equivalent conformal silicon oxide intermediate layer formed through the plasma enhanced chemical vapor deposition (PECVD) method employing the silane silicon source material intervening the otherwise equivalent thermal silicon oxide trench liner layer and the otherwise equivalent gap filling silicon oxide trench fill layer.

3. The method of claim 1 wherein the silicon substrate is a silicon semiconductor substrate and the trench is an isolation trench within the silicon semiconductor substrate.

4. The method of claim 1 wherein the width of the trench is greater than about 0.3 microns and the depth of the trench is from about 3000 to about 5000 angstroms.

5. The method of claim 1 wherein:

the thermal silicon oxide trench liner layer is formed to a thickness of from about 200 to about 400 angstroms; and the conformal silicon oxide intermediate layer is formed to a thickness greater that about 1200 angstroms.

6. The method of claim 1 wherein the ozone assisted sub-atmospheric pressure thermal chemical vapor deposition (SACVD) method employs a reactor chamber pressure of from about 400 to about 600 torr and an ozone:TEOS volume ratio of from about 10:1 to about 15:1.

7. The method of claim 1 further comprising treating the thermal silicon oxide trench liner layer with a nitrogen containing plasma prior to forming upon the thermal silicon oxide trench liner layer the conformal silicon oxide intermediate layer.

8. The method of claim 7 wherein the nitrogen plasma is employed at:

a reactor chamber pressure of from about 1.0 to about 2.0 torr;

a first radio frequency power of from about 50 to about 150 watts at a first radio frequency of 13.56 MHZ and a simultaneous second radio frequency power of from about 400 to about 500 watts at a simultaneous second radio frequency of 350 kHz;

a nitrogen flow rate of from about 400 to about 600 standard cubic centimeters per minute (sccm); and a helium flow rate of from about 1500 to about 2500 standard cubic centimeters per minute.

9. The method of claim 7 wherein:

the thermal silicon oxide trench liner layer is formed to a thickness of from about 200 to about 400 angstroms; and the conformal silicon oxide intermediate layer is formed to a thickness of from about 300 to about 500 angstroms.

10. The method of claim 1 further comprising planarizing the gap filling silicon oxide trench fill layer to form within the trench a planarized gap filling silicon oxide trench fill layer.

11. A silicon substrate having formed therein a trench, the trench being filled with a gap filling silicon oxide trench fill layer in accord with the method of claim 1.

* * * * *